(12) United States Patent
Strijker

(10) Patent No.: US 11,558,047 B2
(45) Date of Patent: Jan. 17, 2023

(54) SWITCHED-MODE POWER SUPPLY CONTROLLER AND METHOD FOR OPERATING A SWITCHED-MODE POWER SUPPLY CONTROLLER

(71) Applicant: NXP B.V., Eindhoven (NL)

(72) Inventor: Joan Wichard Strijker, Wijchen (NL)

(73) Assignee: NXP B.V., Eindhoven (NL)

( * ) Notice: Subject to any disclaimer, the term of this patent is extended or adjusted under 35 U.S.C. 154(b) by 282 days.

(21) Appl. No.: 16/841,533

(22) Filed: Apr. 6, 2020

(65) Prior Publication Data
US 2021/0313977 A1    Oct. 7, 2021

(51) Int. Cl.
| | | |
|---|---|---|
| *H02M 1/08* | (2006.01) | |
| *H03K 17/0812* | (2006.01) | |
| *H02M 1/32* | (2007.01) | |
| *H02M 3/158* | (2006.01) | |
| *H02M 3/335* | (2006.01) | |
| *H03K 17/16* | (2006.01) | |

(52) U.S. Cl.
CPC ........ *H03K 17/08122* (2013.01); *H02M 1/08* (2013.01); *H02M 1/32* (2013.01); *H02M 3/1582* (2013.01); *H02M 3/3353* (2013.01); *H03K 17/161* (2013.01)

(58) Field of Classification Search
CPC ..................................................... H02M 1/08
See application file for complete search history.

(56) References Cited

U.S. PATENT DOCUMENTS

| | | | |
|---|---|---|---|
| 5,298,797 A | 3/1994 | Redl | |
| 10,141,848 B2* | 11/2018 | Zhang | ................. H02M 1/4225 |
| 2018/0123580 A1 | 5/2018 | Kim et al. | |
| 2018/0226891 A1 | 8/2018 | Zhang | |

OTHER PUBLICATIONS

Balogh, Laszlo "Fundamentals of MOSFET and IGBT Gate Driver Circuits", Texas Instruments Application Report, SLUA618A—Mar. 2017—Revised Oct. 2018, 48 pgs.
Baierl, Hubert "Solving Critical Ground-Shift Problems", Power Supply Design, Issue 4 2018 Power Electronics Europe, 3 pgs.

* cited by examiner

*Primary Examiner* — Patrick O Neill

(57) ABSTRACT

Embodiments of an SMPS controller and a method for operating a switched-mode power supply (SMPS) controller are described. In an embodiment, an SMPS controller includes a gate driver circuit configured to generate a drive signal for a switch of an SMPS and a current sense electrical terminal configured to receive sensed current corresponding to the switch and to conduct driver discharge current from the gate driver circuit.

20 Claims, 7 Drawing Sheets

SWITCHED-MODE POWER SUPPLY CONTROLLER AND METHOD FOR OPERATING A SWITCHED-MODE POWER SUPPLY CONTROLLER

BACKGROUND

Embodiments of the invention relate generally to electrical circuits and methods and, more particularly, to power supply controllers and methods for operating power supply controllers.

A switched-mode power supply (SMPS) converts an input voltage and/or current to a desired output voltage and/or current using a switching power stage. For an SMPS controller with an integrated driver, it is advantageous to have a ground connection for the integrated driver in order to isolate driver noise from the analog/signal ground. However, if electrical terminal or pin count is limited in a packaged SMPS controller integrated circuit (IC) chip, for example, for cost reasons, an additional ground electrical terminal or pin may be undesired. Therefore, there is a need for an SMPS controller with limited numbers of electrical terminals or pins that can have a ground connection to isolate driver noise from the analog/signal ground.

SUMMARY

Embodiments of an SMPS controller and a method for operating an SMPS controller are described. In an embodiment, an SMPS controller includes a gate driver circuit configured to generate a drive signal for a switch of an SMPS and a current sense electrical terminal configured to receive sensed current corresponding to the switch and to conduct driver discharge current from the gate driver circuit. Other embodiments are also described.

In an embodiment, the SMPS controller further includes a current comparator configured to compare the sensed current with a reference current.

In an embodiment, the gate driver circuit, the current comparator, and the current sense electrical terminal are electrically connected to an electrical connection point.

In an embodiment, the current comparator includes an input terminal configured to receive the sensed current, and wherein the input terminal of the the current comparator, the gate driver circuit, and the current sense electrical terminal are electrically connected to the electrical connection point.

In an embodiment, the SMPS controller further includes a current source configured to generate the reference current.

In an embodiment, the SMPS controller further includes an error amplifier configured to generate an output signal based on a difference between an input voltage that corresponds to an output voltage of the SMPS and a reference voltage.

In an embodiment, the SMPS controller further includes a pulse width modulation (PWM) controller configured to generate a PWM signal to control the gate driver circuit in response to the output signal of the error amplifier.

In an embodiment, the SMPS controller further includes a voltage source configured to generate the reference voltage.

In an embodiment, the SMPS controller further includes a second electrical terminal configured to transmit the drive signal to a gate terminal of the switch.

In an embodiment, the SMPS controller further includes a third electrical terminal configured to receive a supply voltage for the gate driver circuit.

In an embodiment, the SMPS controller is a packaged IC device.

In an embodiment, the SMPS controller further includes a ground connection electrical terminal, and the driver discharge current from the gate driver circuit is not conducted to electrical ground through the ground connection electrical terminal.

In an embodiment, an SMPS controller includes a first gate driver circuit configured to generate a first drive signal for a first switch of an SMPS, a second gate driver circuit configured to generate a second drive signal for a second switch of the SMPS, a current sense electrical terminal configured to receive sensed current corresponding to the first and second switches and to conduct first and second driver discharge currents from the first and second gate driver circuits, and a ground connection electrical terminal, wherein the first and second driver discharge currents are not conducted to electrical ground through the ground connection electrical terminal.

In an embodiment, the SMPS controller further includes a current comparator configured to compare the sensed current with a reference current, and wherein the first and second gate driver circuits, the current comparator, and the current sense electrical terminal are electrically connected to an electrical connection point.

In an embodiment, the SMPS controller further includes an error amplifier configured to generate an output signal based on a difference between an input voltage that corresponds to an output voltage of the SMPS and a reference voltage.

In an embodiment, the SMPS controller further includes a PWM controller configured to generate first and second PWM signals to control the first and second gate driver circuits in response to the output signal of the error amplifier.

In an embodiment, SMPS controller further includes a third electrical terminal configured to transmit the first drive signal to a gate terminal of the first switch and a fourth electrical terminal configured to transmit the second drive signal to a gate terminal of the second switch.

In an embodiment, the SMPS controller further includes a fifth electrical terminal configured to receive a supply voltage for the first and second gate driver circuits.

In an embodiment, the SMPS controller is a packaged IC device.

In an embodiment, a method for operating an SMPS controller involves generating a drive signal for a switch of an SMPS using a gate driver circuit of the SMPS controller and conducting driver discharge current from the gate driver circuit through a current sense electrical terminal, at which sensed current corresponding to the switch is received.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
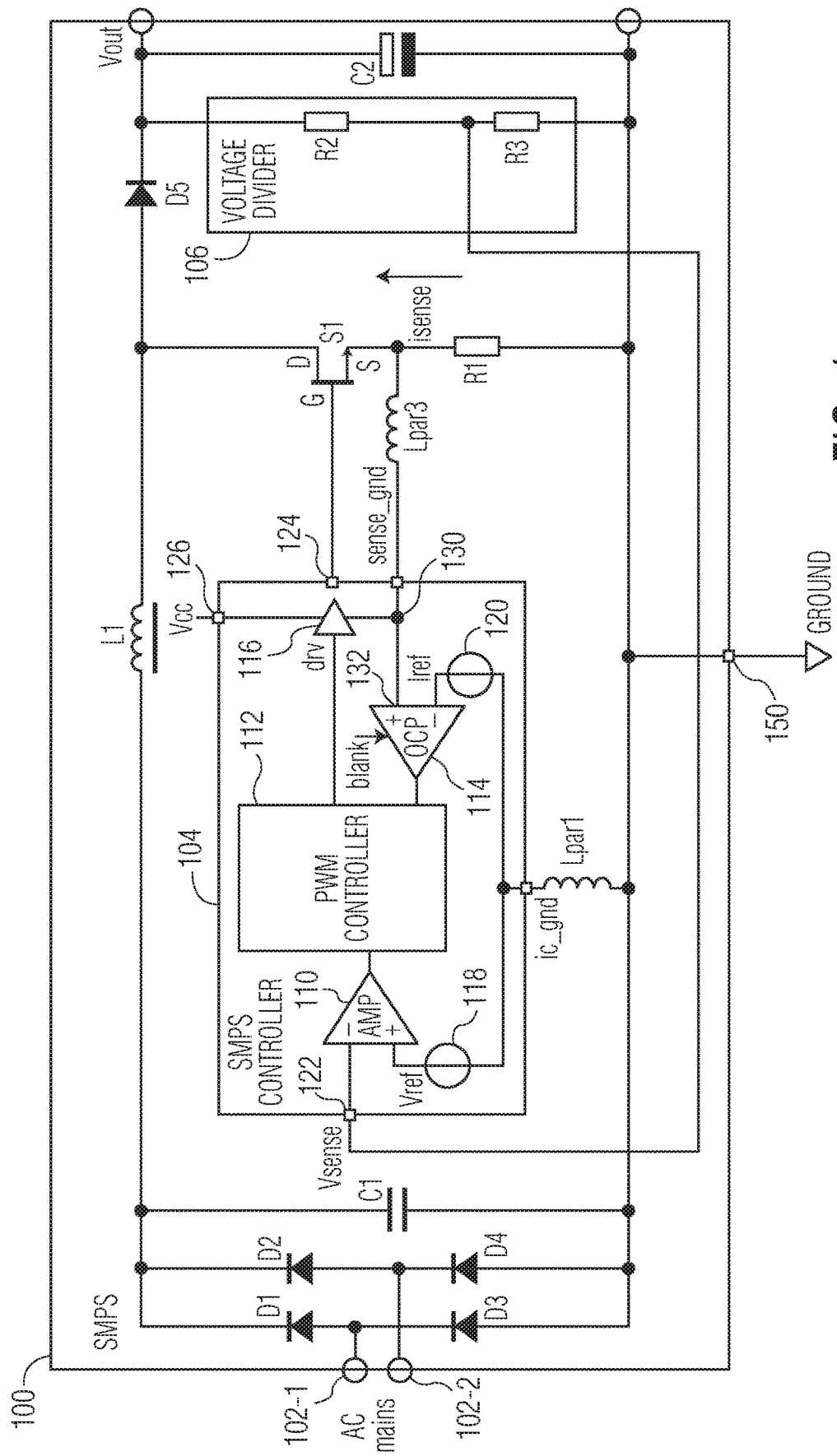
FIG. 1 is a schematic block diagram of an SMPS in accordance with an embodiment of the invention.

FIG. 1 is a schematic block diagram of an SMPS 100 in accordance with an embodiment of the invention. The SMPS converts an input power to a desired output power (e.g., converts an input voltage level to a stable output voltage level for load currents within an acceptable range). For example, the SMPS delivers power available at an input of the SMPS to a load in a controlled manner. In some embodiments, the input power received at the SMPS is Alternating Current (AC) power and the output power is an output voltage, such as a Direct Current (DC) voltage. The SMPS can be used in various applications, such as automotive applications, communications applications, industrial applications, medical applications, computer applications, and/or consumer or appliance applications. For example, the SMPS may be included in a computing device, such as a smartphone, a tablet computer, a laptop, etc. In some embodiments, the flyback converter is a buck-boost converter.

In the embodiment depicted in FIG. 1, the SMPS 100 includes input terminals 102-1, 102-2, bridge rectifier diodes, "D1," "D2," "D3," and "D4," an input capacitor, "C1," an SMPS controller 104, a switch that is implemented as, for example, a metal-oxide-semiconductor field-effect transistor (MOSFET), "S1," a resistor, "R1," an inductor, "L1," a diode, "D5," an output capacitor, "C2," and two resistors, "R2," "R3," that operate as a voltage divider 106. In some embodiments, the inductor, L1, is electrically connected to the drain terminal, "D," of the MOSFET switch, S1, the SMPS controller is electrically connected to the gate terminal, "G," of the MOSFET, S1, and the resistor, R1, is electrically connected to the source terminal, "S," of the MOSFET switch, S1. In some embodiments, the SMPS controller is implemented on a substrate, such as a semiconductor wafer or a printed circuit board (PCB). In an embodiment, the SMPS controller is packaged as a stand-alone semiconductor Integrated Circuit (IC) chip. Although the SMPS is shown in FIG. 1 as including certain circuit elements, in other embodiments, the SMPS may include one or more additional/different circuit elements. For example, although the SMPS is shown in FIG. 1 as including the MOSFET switch, S1, in other embodiments, the SMPS may include other type of switches.

In the embodiment depicted in FIG. 1, the input terminals 102-1, 102-2 of the SMPS 100 are connected to AC mains, which supply AC power to the input capacitor, C1, through the bridge rectifier diodes, D1, D2, D3 and D4. The received energy is transferred to the output capacitor, C2, via the inductor, T1, and the diode, D5. The output voltage, "Vout," of the SMPS is controlled by the two resistors, R2, R3, that operate as the voltage divider 106.

In the embodiment depicted in FIG. 1, the SMPS controller 104 includes an error amplifier (AMP) 110, a pulse width modulation (PWM) controller 112, an over-current comparator (OCP) 114, a gate driver circuit, "drv," 116 configured to generate a drive signal for the MOSFET, S1, a voltage source 118 that generates a reference voltage, "Vref," for the error amplifier 110, and a current source 120 that generates a reference current, "Iref," for the OCP 114. In some embodiments, the SMPS controller is implemented in a substrate and is packaged as a stand-alone semiconductor IC device or chip. In the embodiment depicted in FIG. 1, the SMPS 100 is a power factor correction (PFC) circuit and the SMPS controller drives the MOSFET, S1, via the gate driver circuit 116 with a PWM signal to create a PFC function. However, in other embodiments, the SMPS may be a flyback SMPS that includes a transformer having an auxiliary winding, a primary winding, and/or a secondary winding, or an inductor-inductor-capacitor (LLC) resonant converter.

In the embodiment depicted in FIG. 1, an input voltage, Vsense, is generated by the voltage divider 106 that is formed by the resistors, R2, R3, and is input to the error amplifier 110 of the SMPS controller 104 through an electrical terminal or pin 122. The error amplifier is configured to generate an output signal to the PWM controller 112 based on the voltage difference between the input voltage, Vsense, and the reference voltage, Vref. The PWM controller 112 is configured to generate a PWM signal to control the gate driver circuit in response to the output signal of the error amplifier. The OCP 114 is configured to compare the reference current, Iref, with a sensed current that is received from the MOSFET, S1, through a current sense input terminal or pin, sense_gnd, of the SMPS controller. In some embodiments, the output of the OCP is blanked to prevent an over-current protection circuit to be triggered unintentionally. The gate driver circuit 116 is configured to generate a driver signal that is applied to the gate terminal of the MOSFET, S1, through an electrical terminal or pin 124 of the SMPS controller. The gate driver circuit may operate in response to a supply voltage, Vcc, that is received from through an electrical terminal or pin 126 of the SMPS controller.

In the embodiment depicted in FIG. 1, the output voltage, Vout, of the SMPS 100 is regulated via the input voltage, Vsense, through the error amplifier 110 of the SMPS controller 104. The output voltage, Vout, is measured via the resistive divider formed by the resistors, R2, and, R3. The PWM controller 112 uses the error signal of the error amplifier 110 to control the output voltage, Vout, to Vout=Vref*(Rs2+Rs3)/Rs3, where Rs2 represents the resistance of the resistor, R2, and Rs3 represents the resistance of the resistor, R3. The output voltage, Vout, may be larger than the peak of the AC mains input voltage. The ground electrical terminal or pin, ic_gnd, of the SMPS controller typically has a certain distance to the reference ground electrical terminal or pin 150 of the SMPS 100, which may be located at the printed circuit board (PCB) of the SMPS. The IC ground pin, ic_gnd, may be connected to the reference ground via a PCB trace, which has a typical inductance of around 1 nH/millimeter (mm). In a typical SMPS PCB layout, this PCB trace can be up to a few centimeters in length, resulting in some tens of nano Henries of parasitic inductance, which is labeled in FIG. 1 as, "Lpar1."

In an SMPS controller that the discharge/sink current of the gate driver circuit 116 runs through the parasitic inductance, Lpar1, the di/dt of this current creates a voltage across the parasitic inductance, Lpar1: Unoise=Lpar1*di/dt. Because switched mode power supplies typically switch with frequencies of 50 kHz or more and for larger powers the gate capacitance of the MOSFET, S1, is large, the di/dt can be significant (e.g., with values of 50 A/microsecond (μsec)). For example, if the PCB trace is 2 centimeter (cm), the parasitic inductance is 20 nH, and di/dt is 50 A/usec, the resulting voltage is 20 nH*50 A/usec=1V. Consequently, in an SMPS controller that the discharge/sink current of the gate driver circuit 116 runs through the parasitic inductance, Lpar1, the ground voltage at the pin, ic_gnd, can be disturbed by the driver discharge current. In addition, analog circuits referring to the ground voltage at the pin, ic_gnd, and the reference ground electrical terminal or pin 150 of the SMPS 100 are also disturbed by this noise, which can cause deviation in timing signals and trigger unintentionally protections. Further, when the ground voltage at the pin, ic_gnd, is disturbed, the reference voltage, Vref, is also be disturbed, which can result in a disturbance of the output voltage, Vout, of the SMPS. To overcome this ground noise when switching off the MOSFET, S1, an additional power ground connection, which is separate from the ground connection through the pin, ic_gnd, can be used to connect the gate driver circuit 116 to ground through the reference ground pin 150 of the SMPS. Consequently, the discharge/sink current of the gate driver circuit 116 does not run through the IC ground connection and the ground voltage at the pin, ic_gnd, remains clean/undisturbed. However, the additional power ground connection requires one additional pin in the SMPS controller 104. Because of cost reasons (additional pins typically requiring a larger IC package), the IC pin count of the SMPS controller 104 needs to be kept as low as possible.

In the embodiment depicted in FIG. 1, the current sense input pin, sense_gnd, of the SMPS controller 104 is configured to receive sensed current corresponding to the MOSFET, S1, and to conduct driver discharge current from the gate driver circuit 116. The ground connection of the gate driver circuit 116 is electrically connected to the current sense input pin, sense_gnd, of the SMPS controller 104 at an electrical connection point 130. As depicted in FIG. 1, a positive input terminal 132 of the OCP 114 is configured to receive the sensed current and the positive input terminal of the OCP, the gate driver circuit, and the current sense input pin, sense_gnd, are electrically connected to the electrical connection point 130. As a result, the discharge/sink current of the gate driver circuit is discharged through the current sense input pin, sense_gnd. Consequently, the discharge/sink current of the gate driver circuit does not conduct or flow through the pin, ic_gnd, and the parasitic inductance, Lpar1, and the ground voltage at the pin, ic_gnd, remains clean/undisturbed by the discharge/sink current of the gate driver circuit. In addition, because the discharge/sink current of the gate driver circuit is discharged through the current sense input pin, sense_gnd, the gate driver circuit does not need a dedicated ground connection to the reference ground pin 150 of the SMPS. As depicted in FIG. 1, there is no direct ground connection from the gate driver circuit to the reference ground pin of the SMPS. In addition, compared to an SMPS controller in which an additional power ground connection, which is separate from the ground connection through the pin, ic_gnd, is connected to the gate driver circuit, the SMPS controller 104 has one less pin.

Figure 2:
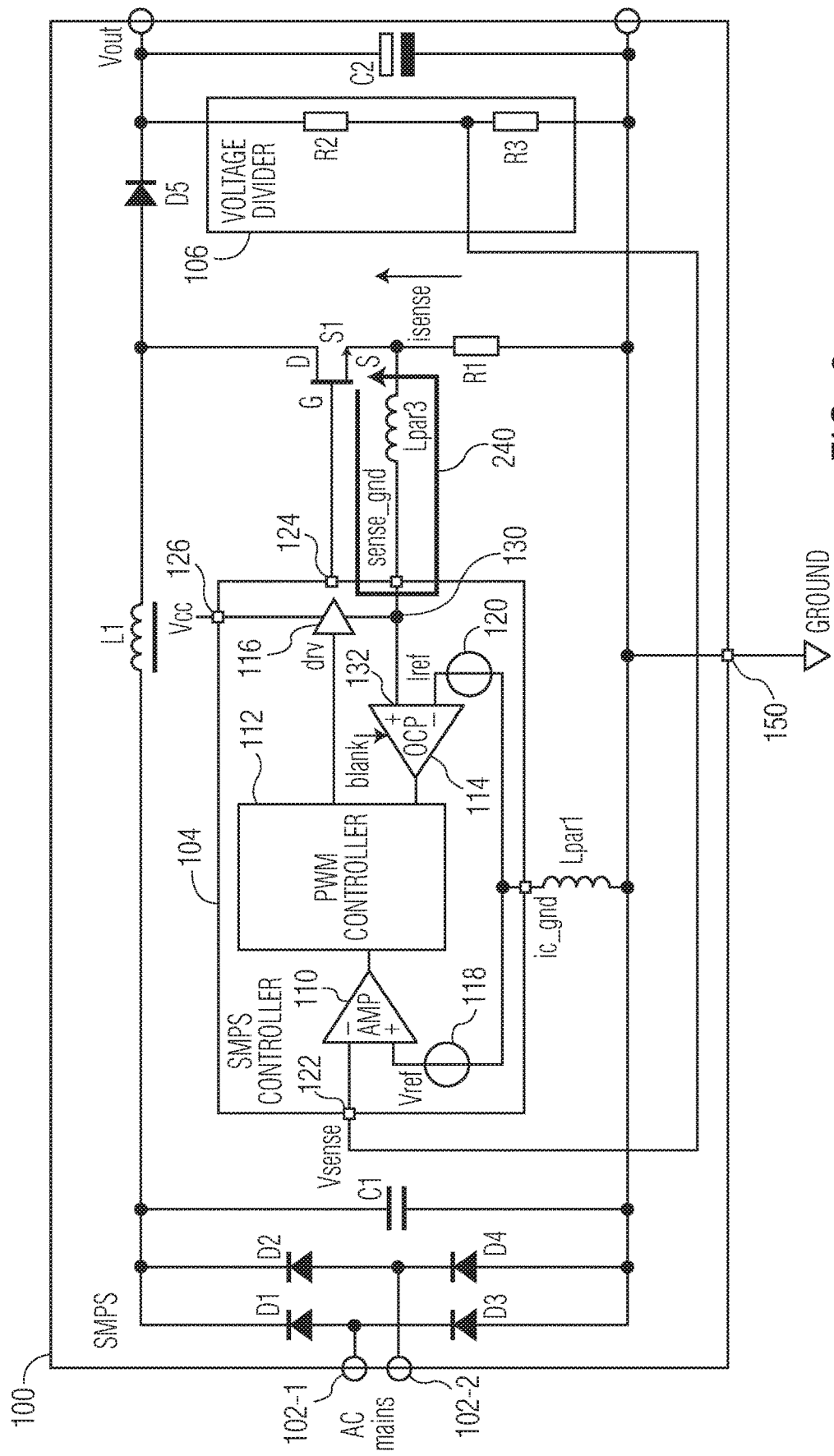
FIG. 2 depicts the SMPS in FIG. 1 with a discharge path of a gate driver circuit of an SMPS controller of the SMPS.

FIG. 2 depicts the SMPS 100 in FIG. 1 with a discharge path 240 of the gate driver circuit 116 of the SMPS controller 104 of the SMPS. As depicted in FIG. 2, the discharge path goes from the gate terminal, G, of the MOSFET, S1, to the gate driver circuit 116, and to the source terminal, S, of the MOSFET, S1, and does not go through the IC ground pin, ic_gnd, of the SMPS controller. Consequently, the ground voltage at the pin, ic_gnd, of the SMPS controller remains undisturbed by the discharge/sink current of the gate driver circuit 116.

Figure 3:
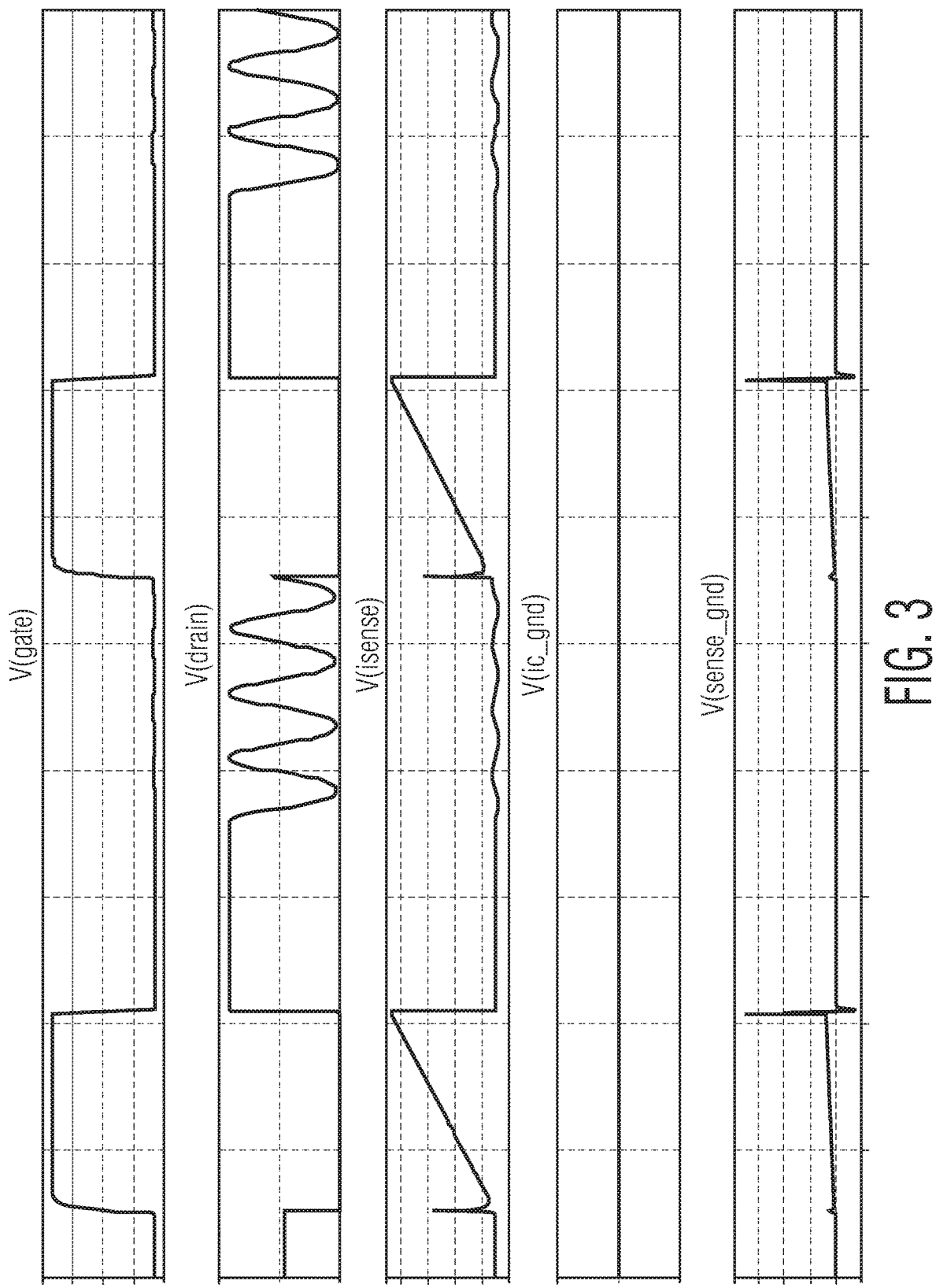
FIG. 3 is a signal timing diagram corresponding to the SMPS depicted in FIG. 1.

FIG. 3 illustrates a signal timing diagram corresponding to the SMPS 100 in FIG. 1. The signals illustrated in FIG. 3 include the gate voltage, V(gate), the drain voltage, V(drain), the current sense voltage, V(isense), the IC ground voltage, V(ic_gnd), at the IC ground pin, ic_gnd, of the SMPS controller 104, and the sense ground voltage, V(sense_ground) at the current sense input pin, sense_gnd, of the SMPS controller. In the signal timing diagram depicted in FIG. 3, the IC ground voltage, V(ic_gnd), at the IC ground pin, ic_gnd, is not disturbed and essentially equal to the reference ground. The sense ground voltage, V(sense_gnd), shows a voltage spike when the gate driver circuit 116 switches off the MOSFET, S1, due to the parasitic inductance, Lpar3, between the current sense input pin, sense_gnd, and the MOSFET, S1. However, this voltage spike does not impede the functionality of the current sense circuit. Specifically, the over current protection circuit reference current, Iref, is not disturbed because the IC ground is not disturbed. In addition, as long as the MOSFET, S1, is conductive, the sense ground voltage, V(sense_gnd), is undisturbed. If an overcurrent occurs when the MOSFEF, S1, is conductive, the PWM controller 112 can switch off the MOSFET, S1, through the gate driver circuit 116. Only after the overcurrent is detected and the MOSFET, S1, is switched off, the noise on at the current sense input pin, sense_gnd, occurs. Consequently, this noise on at the current sense input pin, sense_gnd, does not influence the proper behavior of the OCP 114.

Figure 4:
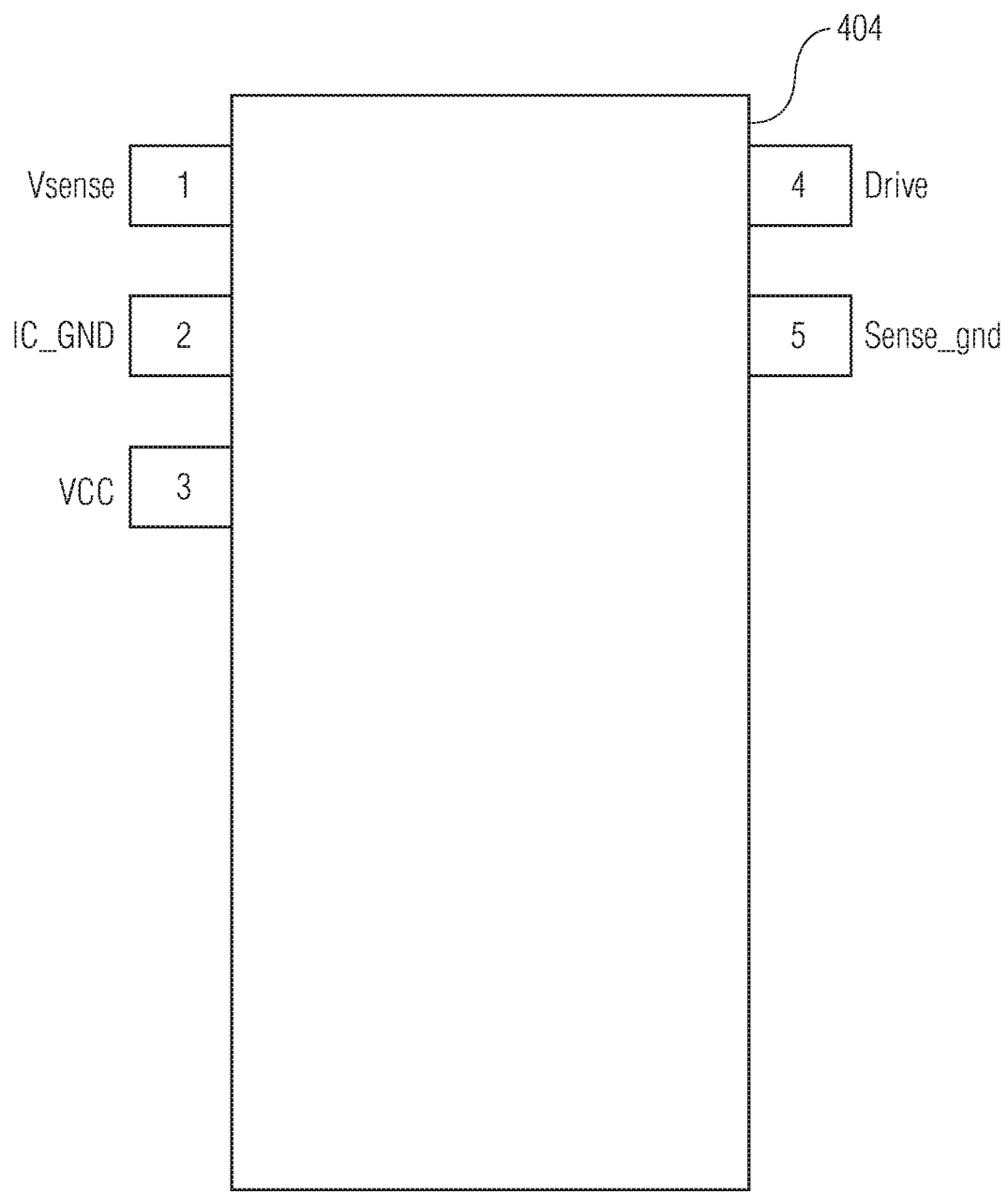
FIG. 4 depicts the SMPS controller of FIG. 1 embodied as a packaged IC device.

FIG. 4 depicts the SMPS controller 104 of FIG. 1 embodied as a packaged IC device 404. As shown in FIG. 4, the packaged IC device includes 5 pins/terminals, Vsense (pin 1, connected to the error amplifier 110), IC_GND (pin 2, ground), VCC (pin 3, supply voltage), Drive (pin 4, connected to the gate driver circuit 116), and SENSE_GND (pin 5, connected to the OCP 114 and to the gate driver circuit). The packaged IC device depicted in FIG. 4 is one possible packaged IC device of the SMPS controller depicted in FIG. 1. However, the packaged IC device of the SMPS controller depicted in FIG. 1 is not limited to the embodiment shown in FIG. 4. For example, although the pins are shown in FIG. 4 as locating outside of the packaged IC device, in other embodiments, some or all of the pins may locate inside/within the packaged IC device.

Figure 5:
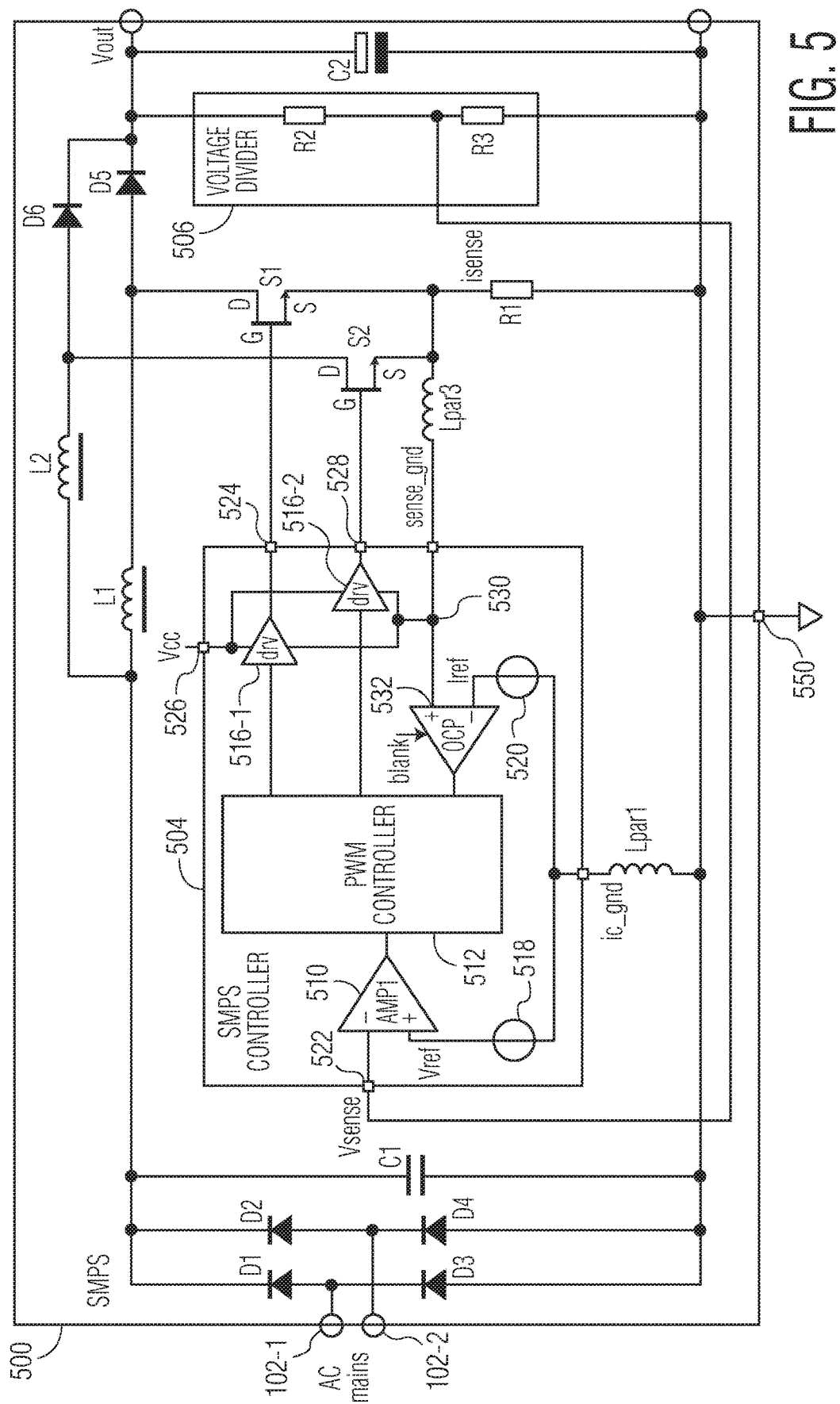
FIG. 5 is a schematic block diagram of an SMPS having an SMPS controller that includes two gate driver circuits in accordance with an embodiment of the invention.

In some embodiments, more than one gate driver circuit is integrated in the SMPS controller 104. FIG. 5 is a schematic block diagram of an SMPS 500 having an SMPS controller 504 that includes two gate driver circuits 516-1, 516-2 in accordance with an embodiment of the invention. The SMPS converts an input power to a desired output power (e.g., converts an input voltage level to a stable output voltage level for load currents within an acceptable range). A difference between the SMPS 500 depicted in FIG. 5 and the SMPS 100 depicted in FIG. 1 is that the SMPS controller 504 of the SMPS 500 depicted in FIG. 5 includes the two gate driver circuits 516-1, 516-2. The gate driver circuit 516-1 is configured to drive the MOSFET, S1, which is electrically connected between the inductor, L1, and the diode, D5, while the gate driver circuit 516-2 is configured to drive a MOSFET, S2, which is electrically connected between an inductor, L2, and a diode, D6. In the embodiment depicted in FIG. 5, the SMPS 500 is an interleaved power factor correction circuit in which both gate driver circuits 516-1, 516-2 use the same current sense input pin, sense_gnd, for power ground.

In the embodiment depicted in FIG. 5, the SMPS 500 includes the input terminals 102-1, 102-2, the bridge rectifier diodes, D1, D2, D3, and D4, the input capacitor, C1, the SMPS controller 504, two MOSFETs, S1, S2, the resistor, R1, two inductors, L1, L2, diode, D5, D5, the output capacitor, C2, and the two resistors, R2, R3, that operate as a voltage divider 506. In some embodiments, the inductor, L1, is connected to the drain terminal, D, of the MOSFET switch, S1, the SMPS controller is connected to the gate terminal, G, of the MOSFET switch, S1, and the resistor, R1, is connected to the source terminal, S, of the MOSFET switch, S1. In these embodiments, the inductor, L2, is connected to the drain terminal, D, of the MOSFET switch, S2, the SMPS controller is connected to the gate terminal, G, of the MOSFET switch, S2, and the resistor, R1, is connected to the source terminal, S, of the MOSFET switch, S2. In some embodiments, the SMPS controller is implemented on a substrate, such as a semiconductor wafer or a PCB. In an embodiment, the SMPS controller is packaged as a stand-alone semiconductor IC chip. Although the SMPS is shown in FIG. 5 as including certain circuit elements, in other embodiments, the SMPS may include one or more additional/different circuit elements. For example, although the SMPS is shown in FIG. 5 as including the MOSFET switches, S1, S2, in other embodiments, the SMPS may include other type of switches.

In the embodiment depicted in FIG. 5, the SMPS controller 504 includes an error amplifier 510, a PWM controller 512 configured to generate PWM signals to control gate driver circuits 516-, 516-2 in response to an output signal of the error amplifier, an over-current comparator (OCP) 514, the gate driver circuits 516-, 516-2, a voltage source 518 that generates a reference voltage, "Vref," for the error amplifier 510, and a current source 520 that generates a reference current, "Iref," for the OCP 514. The error amplifier is configured to generate an output signal to the PWM controller 512 based on the voltage difference between the input voltage, Vsense, and the reference voltage, Vref. The OCP 514 is configured to compare the reference current, Iref, with a sensed current that is received from the current sense input terminal or pin, sense_gnd, of the SMPS controller. In some embodiments, the output of the OCP is blanked to prevent an over-current protection circuit to be triggered unintentionally. The gate driver circuit 516-1 is configured to generate a driver signal that is applied to the gate terminal, G, of the MOSFET, S1, through an electrical terminal or pin 524 of the SMPS controller. The gate driver circuit 516-2 is configured to generate a driver signal that is applied to the gate terminal, G, of the MOSFET, S2, through an electrical terminal or pin 528 of the SMPS controller. The gate driver circuit may operate in response to a supply voltage, Vcc, that is received from through an electrical terminal or pin 526 of the SMPS controller. In some embodiments, the SMPS controller is implemented in a substrate and is packaged as a stand-alone semiconductor IC device or chip. In the embodiment depicted in FIG. 5, the SMPS 500 is an interleaved PFC circuit and the SMPS controller drives the MOSFET switches, S1, S2, via the gate driver circuits 516-1, 516-2 with PWM signals to create a PFC function. However, in other embodiments, the SMPS may be a flyback SMPS that includes a transformer having an auxiliary winding, a primary winding, and/or a secondary winding, or an LLC resonant converter.

In the embodiment depicted in FIG. 5, the output voltage, Vout, of the SMPS 500 is regulated via the input voltage, Vsense, through the error amplifier 510 of the SMPS controller 504. The output voltage, Vout, is measured via the resistive divider formed by the resistors, R2, and, R3. The PWM controller 512 uses the error signal of the error amplifier to control the output voltage, Vout, to Vout=Vref* (Rs2+Rs3)/Rs3, where Rs2 represents the resistance of the resistor, R2, and Rs3 represents the resistance of the resistor, R3. The output voltage, Vout, may be larger than the peak of the AC mains input voltage.

In the embodiment depicted in FIG. 5, the ground connections of the gate driver circuits 516-1, 516-2 are electrically connected to the current sense input pin, sense_gnd, of the SMPS controller 504 at an electrical connection point 530. As depicted in FIG. 5, a positive input terminal 532 of the OCP 514 is configured to receive the sensed current and the positive input terminal of the OCP, the gate driver circuits 516-1, 516-2, and the current sense input pin, sense_gnd, are electrically connected to the electrical connection point 530. As a result, the discharge/sink currents of the gate driver circuits 516-1, 516-2 are discharged through the current sense input pin, sense_gnd. Consequently, the discharge/sink currents of the gate driver circuits 516-1, 516-2 do not conduct or flow through the pin, ic_gnd, which is electrically connected to the reference ground electrical terminal or pin 550 of the SMPS 500, and the parasitic inductance, Lpar1, and the ground voltage at the pin, ic_gnd, remains clean/undisturbed by the discharge/sink current of the gate driver circuits 516-1, 516-2. In addition, compared to an SMPS controller in which an additional power ground connection, which is separate from the ground connection through the pin, ic_gnd, is connected to the gate driver circuit, the SMPS controller 504 has one less pin.

Figure 6:
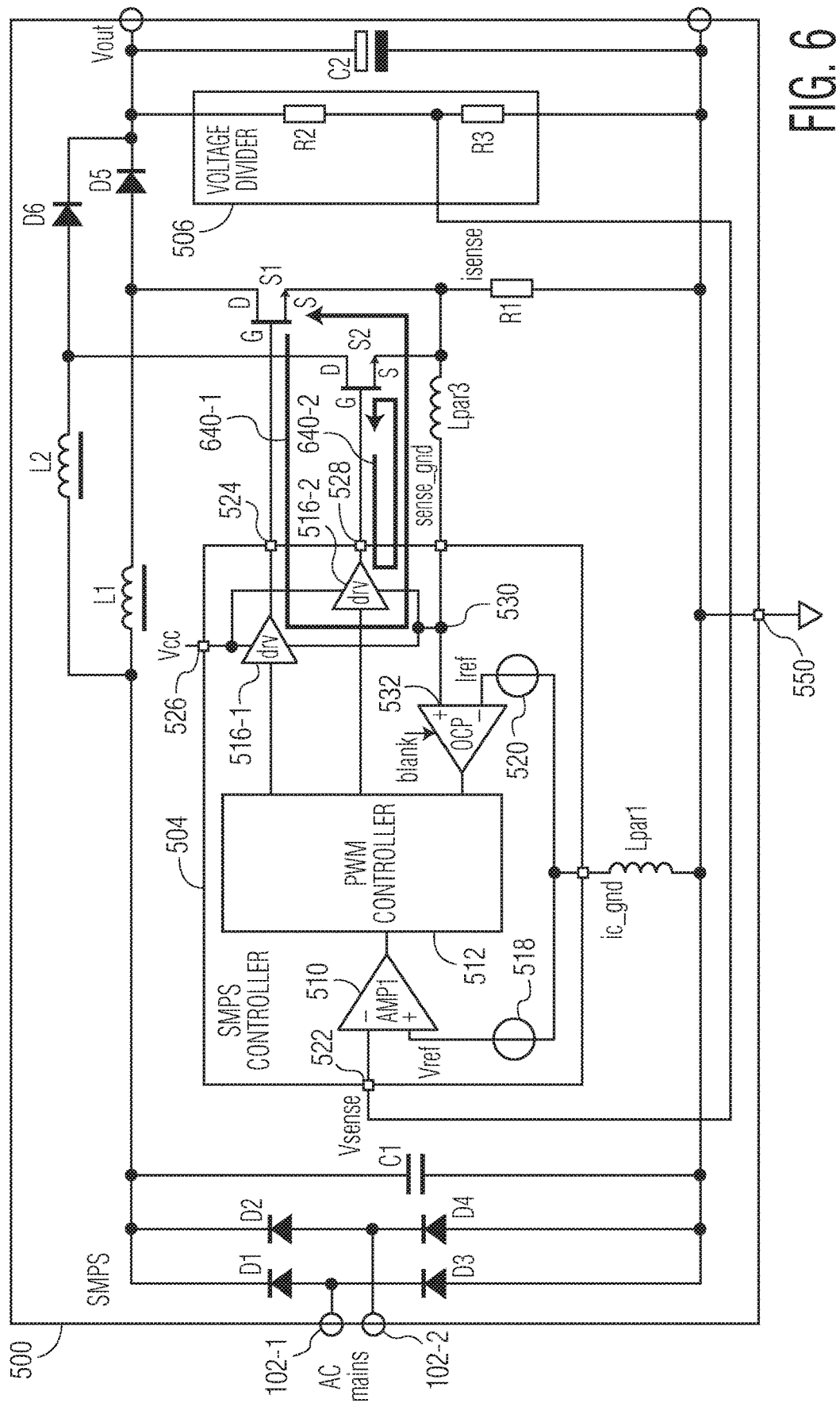
FIG. 6 depicts the SMPS in FIG. 5 with two discharge paths of the two gate driver circuits.

FIG. 6 depicts the SMPS 500 in FIG. 5 with two discharge paths 640-1, 640-2 of the gate driver circuits 516-1, 516-2 of the SMPS controller 504. As depicted in FIG. 6, the discharge paths 640-1, 640-2 go from the gate terminals, G, of the MOSFETs, S1, S2, to the gate driver circuits 516-1, 516-2, and to the source terminals, S, of the MOSFETs, S1, S2, and do not go through the IC ground pin, ic_gnd, of the SMPS controller. Consequently, the ground voltage at the pin, ic_gnd, of the SMPS controller remains undisturbed by the discharge/sink current of the gate driver circuits 516-1, 516-2. As typically in an interleaved PFC, the gate driver circuits 516-1, 516-2 do not turn off at the same moment. In addition to the leading edge blanking for each gate driver circuit that is turned on, the output of the OCP 514 can be be blanked for, e.g., 200 nanoseconds (nsec), the moment at which one of the gate driver circuits 516-1, 516-2 is switched off.

Figure 7:
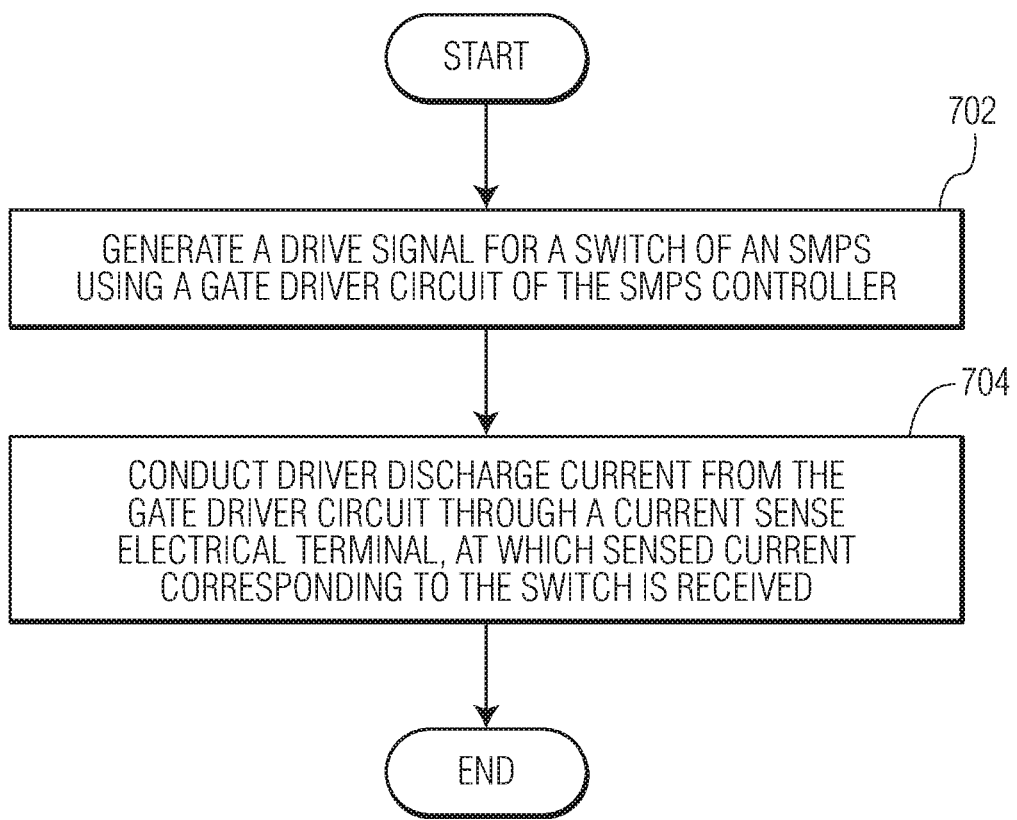
FIG. 7 is a process flow diagram of a method for operating an SMPS controller in accordance with an embodiment of the invention.

FIG. 7 is a process flow diagram of a method for operating an SMPS controller in accordance with an embodiment of the invention. At block 702, a drive signal for a switch of an SMPS is generated using a gate driver circuit of the SMPS controller. At block 704, driver discharge current from the gate driver circuit is conducted through a current sense electrical terminal, at which sensed current corresponding to the switch is received. The SMPS controller may be the same as or similar to the SMPS controller 104 depicted in FIG. 1 and/or the SMPS controller 504 depicted in FIG. 5.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A switched-mode power supply (SMPS) controller, the SMPS controller comprising:
a gate driver circuit configured to generate a drive signal for a switch of an SMPS; and
a current sense electrical terminal configured to receive sensed current corresponding to the switch and to conduct driver discharge current from the gate driver circuit.

2. The SMPS controller of claim 1, wherein the SMPS controller further comprises a current comparator configured to compare the sensed current with a reference current.

3. The SMPS controller of claim 2, wherein the gate driver circuit, the current comparator, and the current sense electrical terminal are electrically connected to an electrical connection point.

4. The SMPS controller of claim 3, wherein the current comparator comprises an input terminal configured to receive the sensed current, and wherein the input terminal of the the current comparator, the gate driver circuit, and the current sense electrical terminal are electrically connected to the electrical connection point.

5. The SMPS controller of claim 2, wherein the SMPS controller further comprises a current source configured to generate the reference current.

6. The SMPS controller of claim 1, wherein the SMPS controller further comprises an error amplifier configured to generate an output signal based on a difference between an input voltage that corresponds to an output voltage of the SMPS and a reference voltage.

7. The SMPS controller of claim 6, wherein the SMPS controller further comprises a pulse width modulation (PWM) controller configured to generate a PWM signal to control the gate driver circuit in response to the output signal of the error amplifier.

8. The SMPS controller of claim 6, wherein the SMPS controller further comprises a voltage source configured to generate the reference voltage.

9. The SMPS controller of claim 1, wherein the SMPS controller further comprises a second electrical terminal configured to transmit the drive signal to a gate terminal of the switch.

10. The SMPS controller of claim 9, wherein the SMPS controller further comprises a third electrical terminal configured to receive a supply voltage for the gate driver circuit.

11. The SMPS controller of claim 1, wherein the SMPS controller is a packaged Integrated Circuit (IC) device.

12. The SMPS controller of claim 1, wherein the SMPS controller further comprises a ground connection electrical terminal, and wherein the driver discharge current from the gate driver circuit is not conducted to electrical ground through the ground connection electrical terminal.

13. A switched-mode power supply (SMPS) controller, the SMPS controller comprising:
a first gate driver circuit configured to generate a first drive signal for a first switch of an SMPS;

a second gate driver circuit configured to generate a second drive signal for a second switch of the SMPS;
a current sense electrical terminal configured to receive sensed current corresponding to the first and second switches and to conduct first and second driver discharge currents from the first and second gate driver circuits; and
a ground connection electrical terminal, wherein the first and second driver discharge currents are not conducted to electrical ground through the ground connection electrical terminal.

14. The SMPS controller of claim 13, wherein the SMPS controller further comprises a current comparator configured to compare the sensed current with a reference current, and wherein the first and second gate driver circuits, the current comparator, and the current sense electrical terminal are electrically connected to an electrical connection point.

15. The SMPS controller of claim 13, wherein the SMPS controller further comprises an error amplifier configured to generate an output signal based on a difference between an input voltage that corresponds to an output voltage of the SMPS and a reference voltage.

16. The SMPS controller of claim 15, wherein the SMPS controller further comprises a pulse width modulation (PWM) controller configured to generate first and second PWM signals to control the first and second gate driver circuits in response to the output signal of the error amplifier.

17. The SMPS controller of claim 13, wherein the SMPS controller further comprises:
a third electrical terminal configured to transmit the first drive signal to a gate terminal of the first switch; and
a fourth electrical terminal configured to transmit the second drive signal to a gate terminal of the second switch.

18. The SMPS controller of claim 17, wherein the SMPS controller further comprises a fifth electrical terminal configured to receive a supply voltage for the first and second gate driver circuits.

19. The SMPS controller of claim 13, wherein the SMPS controller is a packaged Integrated Circuit (IC) device.

20. A method for operating a switched-mode power supply (SMPS) controller, the method comprising:
generating a drive signal for a switch of an SMPS using a gate driver circuit of the SMPS controller; and
conducting driver discharge current from the gate driver circuit through a current sense electrical terminal, at which sensed current corresponding to the switch is received.

* * * * *